(12) United States Patent
Ko et al.

(10) Patent No.: US 10,866,673 B2
(45) Date of Patent: Dec. 15, 2020

(54) FORCE SENSOR MODULE AND DISPLAY DEVICE INCLUDING THE SAME

(71) Applicant: Samsung Display Co., Ltd., Yongin-si (KR)

(72) Inventors: Gwang Bum Ko, Suwon-si (KR); Do Ik Kim, Suwon-si (KR); Young Sik Kim, Yongin-si (KR); Sang Chul Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 16/209,441

(22) Filed: Dec. 4, 2018

(65) Prior Publication Data

US 2019/0361558 A1 Nov. 28, 2019

(30) Foreign Application Priority Data

May 28, 2018 (KR) .................. 10-2018-0060443

(51) Int. Cl.
*G06F 3/041* (2006.01)
*H01L 27/32* (2006.01)
*G01L 1/16* (2006.01)
*G06F 3/047* (2006.01)

(52) U.S. Cl.
CPC .............. *G06F 3/0414* (2013.01); *G01L 1/16* (2013.01); *G06F 3/047* (2013.01); *G06F 3/0412* (2013.01); *H01L 27/323* (2013.01)

(58) Field of Classification Search
None
See application file for complete search history.

(56) References Cited

U.S. PATENT DOCUMENTS

| | | | |
|---|---|---|---|
| 2013/0160548 A1* | 6/2013 | Ishida | G01C 19/5607 73/514.29 |
| 2013/0160567 A1* | 6/2013 | Ota | G01L 1/18 73/862.68 |
| 2017/0160149 A1* | 6/2017 | Minami | G01L 1/18 |
| 2018/0299997 A1* | 10/2018 | Isaacson | G06F 3/045 |

FOREIGN PATENT DOCUMENTS

KR    10-2016-0081949 A    7/2016

* cited by examiner

*Primary Examiner* — Christopher J Kohlman
(74) *Attorney, Agent, or Firm* — Lewis Roca Rothgerber Christie LLP

(57) ABSTRACT

Provided are a force sensor module and a display device including the same. The display device includes a display panel, and a force sensor module overlapping the display panel, and including a circuit board, and the force sensor partially attached to the circuit board, and including an attachment portion having a surface facing the circuit board and attached to the circuit board, and a non-attachment portion having a surface spaced apart from the circuit board.

17 Claims, 16 Drawing Sheets

FORCE SENSOR MODULE AND DISPLAY DEVICE INCLUDING THE SAME

CROSS-REFERENCE TO RELATED APPLICATION

This application claims priority to, and the benefit of, Korean Patent Application No. 10-2018-0060443, filed on May 28, 2018, in the Korean Intellectual Property Office, the disclosure of which is incorporated herein by reference in its entirety.

BACKGROUND

1. Field

The present disclosure relates to a force sensor module and to a display device including the same.

2. Description of Related Art

Electronic devices that provide images to a user, such as a smartphone, a tablet PC, a digital camera, a notebook computer, a navigation system, and a smart television, include a display device for displaying images. The display device includes a display panel that generates and displays an image, and various input devices.

Recently, a touch panel that recognizes a touch input has been widely applied to display devices, mainly in smartphones and tablet PCs. Due to the convenience of a touch method, the touch panel is replacing an existing physical input device, such as a keypad.

A force sensor senses the force applied to the sensor, and a piezoelectric element is mainly used as the force sensor. One of the methods of measuring a force using a piezoelectric element is to measure the amount of the force by reading the voltage of the piezoelectric element generated by the force. However, if a constant force is continuously applied to the piezoelectric element, the voltage of the piezoelectric element becomes close to zero because there is no further change in the applied force that is perceived. Therefore, continuous force measurement might not be easy.

SUMMARY

Aspects of the present disclosure provide a display device including a force sensor module with improved force sensing sensitivity. Aspects of the present disclosure also provide a force sensor module with improved force-sensing sensitivity. However, aspects of the present disclosure are not restricted to those set forth herein. The above and other aspects of the present disclosure will become more apparent to one of ordinary skill in the art to which the present disclosure pertains by referencing the detailed description of the present disclosure given below.

An embodiment of a display device includes a display panel, and a force sensor module overlapping the display panel, and including a circuit board, and a force sensor partially attached to the circuit board, and including an attachment portion having a surface facing the circuit board and attached to the circuit board, and a non-attachment portion having a surface spaced apart from the circuit board.

The force sensor module may further include an attachment layer between the force sensor and the circuit board at the attachment portion.

The attachment layer may be an electrical connection layer.

The force sensor may be electrically connected to the circuit board by the attachment layer.

The attachment layer may be located along an edge of the surface facing the circuit board.

The force sensor may further include a piezoelectric element that is configured to be driven by alternating current (AC) power.

The AC power may have a resonance frequency, an antiresonance frequency, or a frequency between an adjacent resonance frequency and an adjacent antiresonance frequency.

An embodiment of a display device includes a display panel, and a force sensor module overlapping the display panel, and including a force sensor, and a pedestal overlapping the force sensor in a thickness direction.

The force sensor module may further include a circuit board to which the force sensor is at least partially attached, the circuit board being between the force sensor and the pedestal.

The display device may further include a support surrounding side surfaces of, and being spaced apart from, the force sensor.

The force sensor may include an attachment portion in which a surface of the force sensor facing the circuit board is attached to the circuit board, and a non-attachment portion spaced apart from the circuit board.

The force sensor module may further include a first circuit board defining a hole into which the force sensor is inserted, a second circuit board to which the force sensor is at least partially attached, and a connection wiring electrically connecting the first circuit board and the second circuit board.

The force sensor module may further include an adhesive layer between the first circuit board and the second circuit board, and surrounding the force sensor.

The force sensor module may further include a circuit board to which the force sensor is at least partially attached, wherein the force sensor is between the circuit board and the pedestal.

An embodiment of a force sensor module includes a circuit board, and a force sensor partially attached to the circuit board, and including an attachment portion in which a surface of the force sensor facing the circuit board is attached to the circuit board, and a non-attachment portion spaced apart from the circuit board.

The force sensor module may further include an attachment layer between the force sensor and the circuit board at the attachment portion.

The attachment layer may be an electrical connection layer for electrically connecting the force sensor to the circuit board.

The attachment layer may be located along an edge of the surface of the force sensor facing the circuit board.

The force sensor module may further include a pedestal overlapping the force sensor, wherein the circuit board is between the force sensor and the pedestal.

The force sensor module may further include a support surrounding side surfaces of, and spaced apart from, the force sensor.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
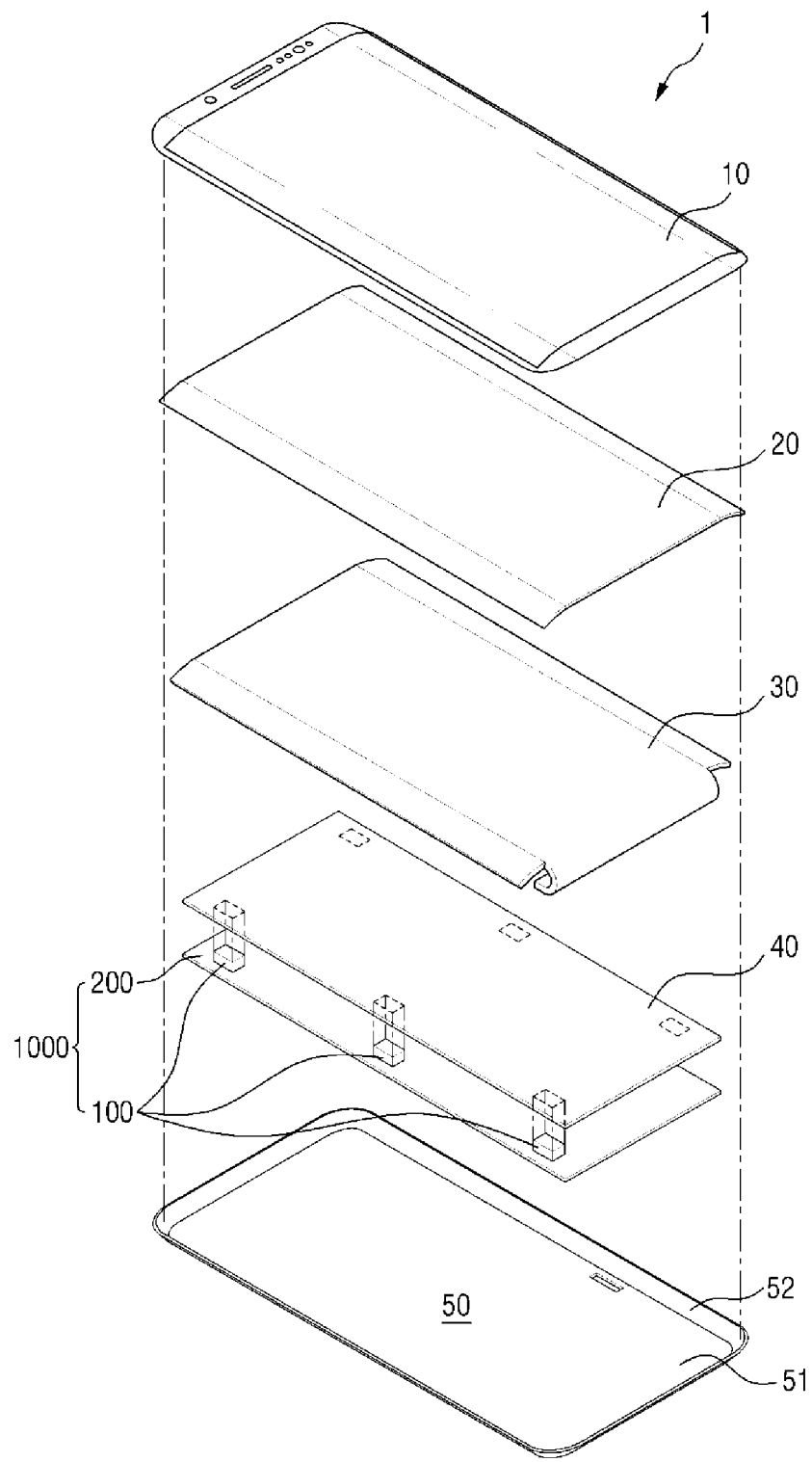
FIG. 1 is an exploded perspective view of a display device according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present invention.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
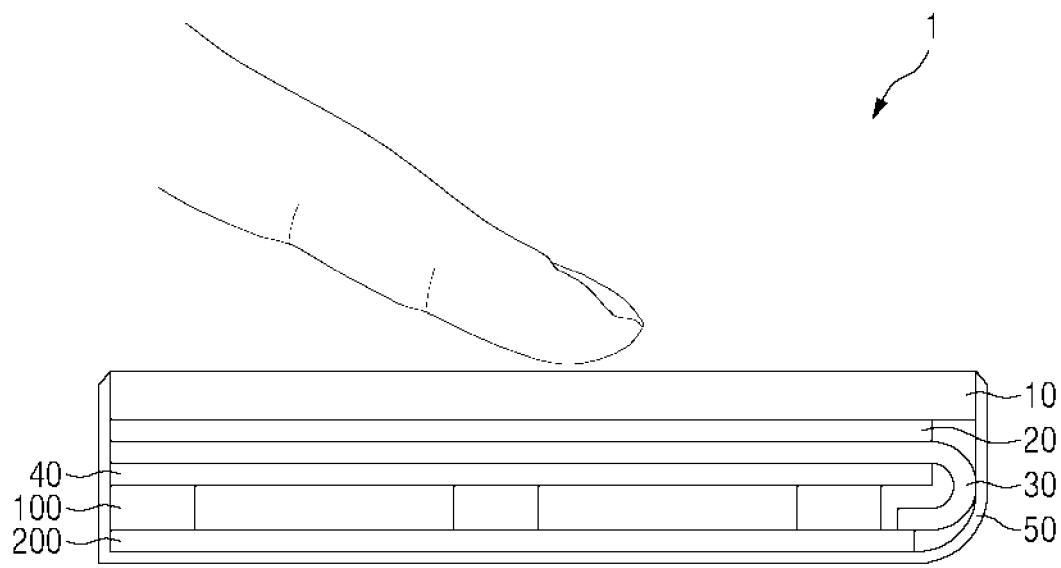
FIG. 2 is a cross-sectional view of the display device according to the embodiment.

FIG. 1 is an exploded perspective view of a display device 1 according to an embodiment. FIG. 2 is a cross-sectional view of the display device 1 according to the embodiment.

Referring to FIGS. 1 and 2, the display device 1 includes a display panel 30, a window 10 located above the display panel 30, and a force sensor module 1000 located below the display panel 30. The display device 1 may further include a touch member 20 located between the display panel 30 and the window 10, a cover panel 40 located below the display panel 30, and a bracket 50 for housing the above members. In an embodiment, the force sensor module 1000 may be located below the cover panel 40. However, the force sensor module 1000 may also be located on or at a side of the cover panel 40.

Unless otherwise defined, the terms "above" and "upper surface" in a thickness direction, as used herein, denote a display surface side of the display panel 30, and the terms "below" and "lower surface" in the thickness direction, as used herein, denote an opposite side of the display panel 30 from the display surface side. In addition, the terms "above (upper)," "below (lower)," "left," and "right" in a planar direction refer to directions when a display surface placed in position is viewed from above.

The display panel 30 is a panel for displaying a screen, and may be, for example, an organic light emitting display panel. In the following embodiments, a case where an organic light emitting display panel is applied as the display panel 30 will be described as an example. However, other types of display panels, such as a liquid crystal display panel and an electrophoresis display panel, may also be applied. A display flexible circuit board may be coupled to the display panel 30.

The display panel 30 includes a plurality of organic light emitting elements located on a substrate. The substrate may be a rigid substrate made of glass, quartz, or the like, or may be a flexible substrate made of polyimide or other polymer resins. When a polyimide substrate is applied as the substrate, the display panel 30 can be bent or curved, folded, or rolled. Although the display panel 30 is bent in the drawings, the present disclosure is not limited to this case.

The touch member 20 is located on the display panel 30. The touch member 20 may be of a rigid panel type, a flexible panel type, or a film type. The touch member 20 may have substantially the same size as the display panel 30, and may overlap the display panel 30. Side surfaces of the touch member 20 may be, but are not necessarily, aligned with side surfaces of the display panel 30 at all sides excluding a bent short side of the display panel 30. The display panel 30 and the touch member 20 may be bonded together by a transparent bonding layer, such as an optically clear adhesive (OCA) or an optically clear resin (OCR). A touch flexible circuit board may be coupled to the touch member 20.

The touch member 20 may be omitted or provided inside the display panel 30. In this case, the display panel 30 may include a touch electrode portion.

The window 10 is located above the display panel 30. As a cover plate, the window 10 overlaps the display panel 30 and/or the touch member 20 in the thickness direction to protect the members located below the window 10 while transmitting light emitted from the display panel 30. The window 10 may be made of glass or transparent plastic.

The cover panel 40 is located below the display panel 30. The cover panel 40 may overlap the display panel 30 in the thickness direction. The cover panel 40 may be attached to a lower surface of the display panel 30.

The cover panel 40 may perform a heat dissipating function, an electromagnetic wave shielding function, a pattern detection preventing function, a grounding function, a buffering function, a strength enhancing function and/or a digitizing function. The cover panel 40 may include a functional layer having at least one of the above functions. The functional layer may be provided in various forms, such as a layer, a membrane, a film, a sheet, a plate, and a panel. The cover panel 40 may include one functional layer or a plurality of functional layers. For example, the cover panel 40 may include a buffer sheet, a graphite sheet, and a copper sheet stacked sequentially from top to bottom.

The force sensor module 1000 is located below the cover panel 40. The force sensor module 1000 includes a circuit board 200, and at least one force sensor 100 located on the circuit board 200. One force sensor 100 or a plurality of force sensors 100 may be located on an edge (or on edges) of the circuit board 200, but the present disclosure is not limited to this case. The force sensor module 1000 will be described in detail later.

The bracket 50 is located below the force sensor module 1000. The bracket 50 may be a storage container or a protective container for housing other components. For example, the bracket 50 may house the window 10, the touch member 20, the display panel 30, the cover panel 40, and the force sensor module 1000.

The bracket 50 may include a bottom portion 51, and sidewalls 52 extending from sides of the bottom portion 51. The bottom portion 51 of the bracket 50 faces the circuit board 200 of the force sensor module 1000. The circuit board 200 may be attached to the bottom portion 51 of the bracket 50 by a bonding layer, such as a force-sensitive adhesive layer or an adhesive layer.

The sidewalls 52 of the bracket 50 face side surfaces of the touch member 20, the display panel 30, the cover panel 40, and the force sensor module 1000. Upper ends of the sidewalls 52 of the bracket 50 may face the window 10. The window 10 may be attached to the bracket 50 with a waterproof tape.

Figure 3:
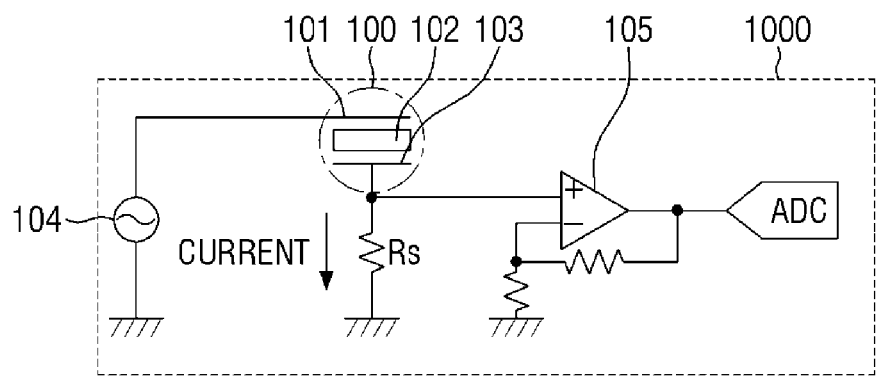
FIG. 3 is an operation circuit diagram of a force sensor module according to an embodiment.

FIG. 3 is a circuit diagram of the force sensor module 1000 according to an embodiment.

A force sensor 100 of the force sensor module 1000 may be a resonant force sensor, a piezoelectric force sensor, a strain-gauge force sensor, or a capacitive force sensor. In the present embodiment, a piezoelectric force sensor will be described as an example.

The force sensor 100 of the force sensor module 1000 may be a piezoelectric element. The force sensor 100 is partially attached to the circuit board 200, and is thus electrically connected to the circuit board 200 in an attachment portion. The force sensor 100 operates by receiving power 104 from the circuit board 200.

The force sensor 100 may include a first electrode 101, a second electrode 103, and a piezoelectric layer 102 located between the first electrode 101 and the second electrode 103. The first electrode 101 and the second electrode 103 are spaced apart from, and face each other, in the thickness direction, and the piezoelectric layer 102 is located between the first electrode 101 and the second electrode 103.

The first electrode 101 of the force sensor 100 receives the power 104 from the circuit board 200, and the second electrode 103 is connected to a resistor Rs and an amplifier 105.

The power 104 is alternating current (AC) power, such as a sine wave or a square wave. Accordingly, because a voltage applied to the force sensor 100 changes continuously, mechanical vibrations occur in the force sensor 100, as if a force was acting on the force sensor 100. When a force is applied to the vibrating force sensor 100, it affects the vibration, thereby changing the impedance of the force sensor 100. Therefore, even when a constant force is continuously applied to the force sensor 100, it is possible to measure the force by sensing the change in the impedance of the force sensor 100.

A method of measuring the impedance of the force sensor 100 according to an embodiment includes measuring a current flowing through the force sensor 100. For example, the change in the impedance of the force sensor 100 may be sensed by identifying a voltage applied to the resistor Rs connected to the second electrode 103.

For example, if the voltage applied to the resistor Rs is large, it may be interpreted that the impedance of the force sensor 100 is small. If the voltage applied to the resistor Rs is small, it may be interpreted that the impedance of the force sensor 100 is large. Therefore, such a difference (the change in the impedance of the force sensor 100) may be used to measure whether a force has been applied and to measure the magnitude of the force. The change in the impedance of the force sensor 100 may be measured within a range between a resonance frequency and an antiresonance frequency of the force sensor 100, as will be described below with reference to FIG. 5.

The piezoelectric layer 102 is formed to a thickness (e.g., a predetermined thickness) between the first electrode 101 and the second electrode 103. For example, the piezoelectric layer 102 may be formed to a thickness of about 10 μm to about 1000 μm. The piezoelectric layer 102 may also be formed to various thicknesses depending on the size of an electronic device in which the force sensor 100 is employed.

The piezoelectric layer 102 may be formed using a substantially quadrilateral plate-shaped piezoelectric body having a thickness (e.g., a predetermined thickness) and a polymer. The piezoelectric body may be formed using a Pb—Zr—Ti (PZT)-, Na—K—Nb (NKN)-, or Bi—Na—Ti (BNT)-based piezoelectric material. For example, the piezoelectric body may include barium titanate, lead titanate, lead zirconate titanate, potassium niobate, lithium niobate, lithium tantalate, sodium tungstate, zinc oxide, potassium sodium niobate, bismuth ferrite, sodium niobate, bismuth titanate, etc. The piezoelectric body may be made of a fluoride polymer, or a copolymer of fluoride polymers, for example.

The piezoelectric layer 102 may also be formed by stacking a plurality of piezoelectric layers, in each of which piezoelectric plates are arranged (e.g., arranged at predetermined intervals) on a thin polymer layer.

The polymer may include, but is not limited to, one or more of epoxy, polyimide, and a liquid crystalline polymer (LCP). The polymer may be made of thermosetting resin. Examples of the thermosetting resin include novolac epoxy resin, phenoxy type epoxy resin, BPA type epoxy resin, BPF type epoxy resin, hydrogenated BPA epoxy resin, dimer acid modified epoxy resin, urethane modified epoxy resin, rubber modified epoxy resin, and DCPD type epoxy resin.

In an embodiment, the polymer may be made of a compressible and recoverable material. For example, the polymer may be made of a compressible and recoverable material from among the above materials. The piezoelectric body may also be mixed with a compressible and recoverable material instead of the polymer mentioned in the above materials. For example, silicon, rubber, gel, phorone, urethane, etc. may be used.

Figure 4A:
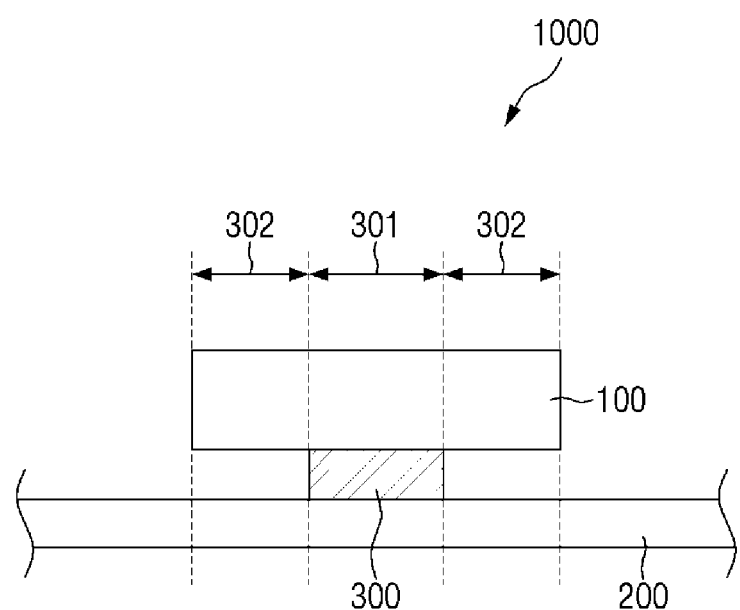
FIG. 4A is a side view of a force sensor according to an embodiment.
Figure 4B:
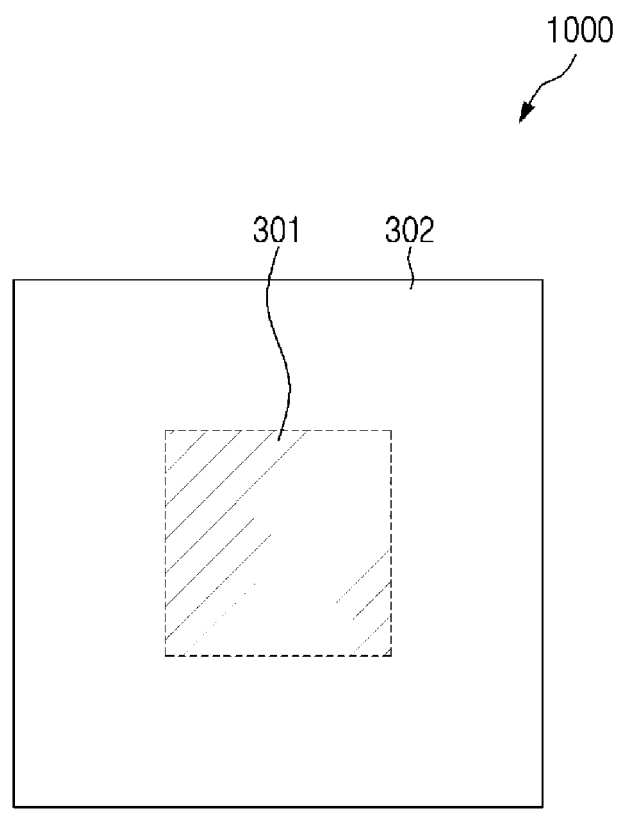
FIG. 4B is a plan view of the force sensor of FIG. 4A.

FIG. 4A is a side view of the force sensor 100 according to an embodiment, and FIG. 4B is a plan view of the force sensor 100 of FIG. 4A.

Referring to FIGS. 4A and 4B, the force sensor module 1000 may further include an attachment layer 300 for attaching the force sensor 100 to the circuit board 200. The attachment layer 300 is formed on a portion of a lower surface of the force sensor 100, and exposes the other portion of the lower surface of the force sensor 100. In the lower surface of the force sensor 100, the area of the portion attached to the circuit board 200 by the attachment layer 300 may be smaller than the area of the portion not attached to the circuit board 200.

For example, the area of the attachment layer 300 may be smaller than the area of the lower surface of the force sensor 100. Accordingly, only part of the total area of the surface of the force sensor 100 that faces the circuit board 200 may be attached to the circuit board 200. The lower surface of the force sensor 100 that is not attached to the circuit board 200 may be spaced apart from the circuit board 200 to face the circuit board 200.

The force sensor 100 may be attached to the circuit board 200 by thermal bonding, friction attachment, ultrasonic attachment, electrical attachment or soldering, or may be attached by an anisotropic conductive film (ACF) or a pressure sensitive adhesive (PSA) interposed between the force sensor 100 and the circuit board 200. A case where the force sensor 100 is attached to the circuit board 200 by thermal bonding will be described below as an example, but the present disclosure is not limited to this case. In the following embodiments, the attachment layer 300 refers to a thermally bonded portion.

The attachment layer 300 may be made of a material that can electrically connect the circuit board 200 and the force sensor 100. Accordingly, the force sensor 100 may receive power from the circuit board 200.

The force sensor module 1000 may be divided into an attachment portion 301 at which the force sensor 100 is attached to the circuit board 200 by the attachment layer 300, and a non-attachment portion 302 at which the force sensor 100 faces the circuit board 200 without the attachment layer 300 therebetween. In an embodiment, the attachment portion 301 may be located at a center of the force sensor 100, and the non-attachment portion 302 may surround the attachment portion 301.

Because only a portion of the force sensor 100 is attached to the circuit board 200 as described above, the change in the impedance of the force sensor 100 may be larger when a force is applied to the force sensor module 1000. This will now be described with reference to FIG. 5.

Figure 5:
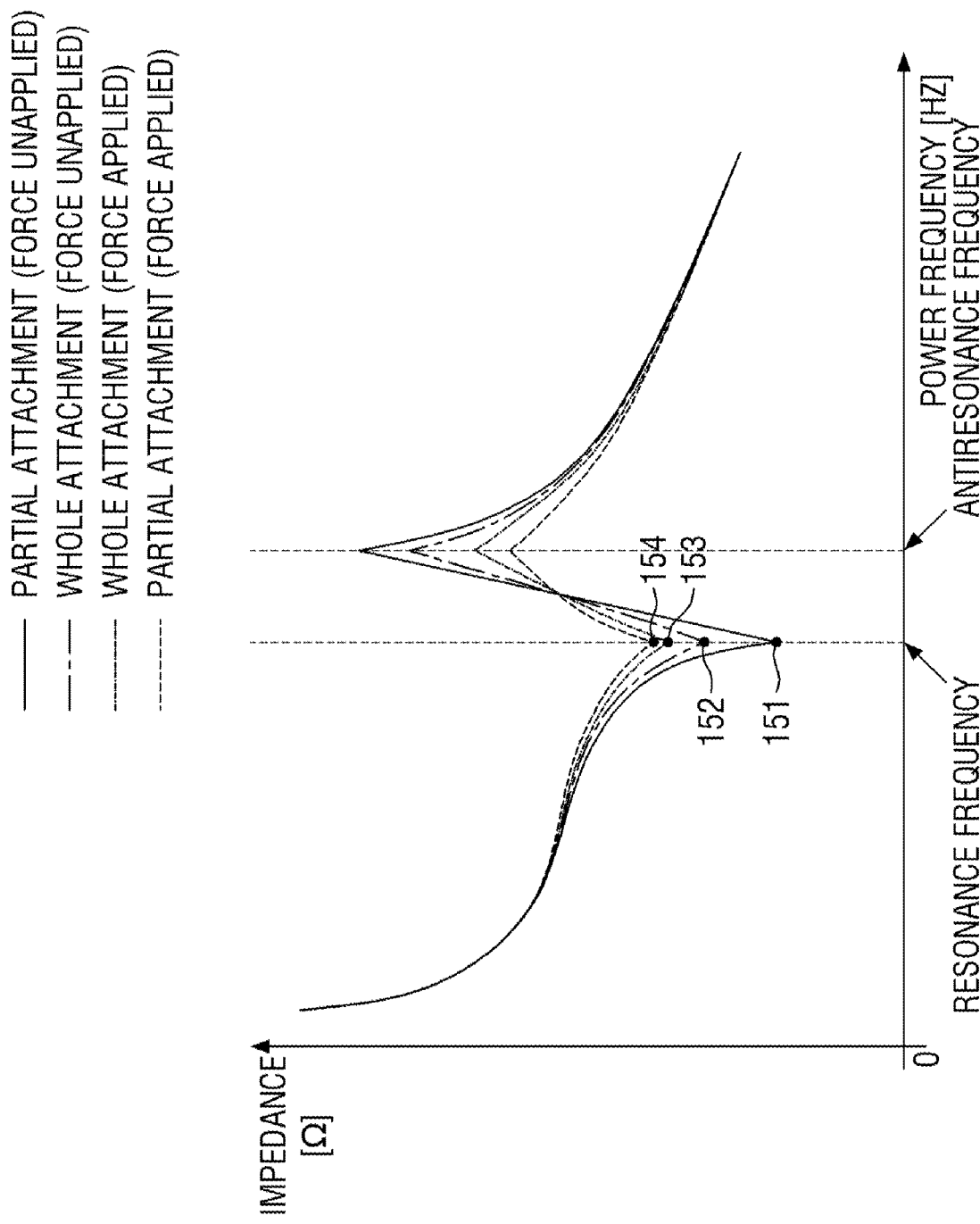
FIG. 5 is a graph illustrating the change in the impedance of a piezoelectric element according to an embodiment.

FIG. 5 is a graph illustrating the change in the impedance of a force sensor according to an embodiment.

The x-axis of the graph illustrated in FIG. 5 represents the frequency [Hz] of power (e.g., power 104 in FIG. 3), and the y-axis represents the impedance [Ω] of the force sensor. FIG. 5 illustrates impedance with respect to frequency in a force applied state/a force unapplied state when the whole (e.g., the entire surface) of the force sensor is attached to a circuit board and when only a portion of the force sensor is attached to the circuit board.

In FIG. 5, a resonance frequency is a frequency at which the impedance of the force sensor 100 measured while changing the frequency of the power reaches a peak point in a section in which the impedance rapidly decreases, and an antiresonance frequency is a frequency at which the impedance reaches a peak point in a section in which the impedance rapidly increases.

Referring to FIG. 5, the impedance of the force sensor is smallest at the resonance frequency, and is largest at the antiresonance frequency. In addition, the change in the impedance of the force sensor is large between the resonance frequency and the antiresonance frequency. Therefore, the sensitivity of force measurement can be improved by using power having a frequency within the range from the resonance frequency to the antiresonance frequency.

In particular, because the change in the impedance is largest at the resonance frequency and at the antiresonance frequency, a frequency adjacent to the resonance frequency or the antiresonance frequency may be used as the power frequency, thereby maximizing force sensing. That is, the resonance frequency ±α or the antiresonance frequency ±α may be adopted as the most suitable power frequency.

It should be noted that the resonance frequency and the antiresonance frequency may be provided not just in one pair, as illustrated in the drawing, but also in plural numbers.

Referring to the graphs of FIG. 5 obtained when power using the resonance frequency as the power frequency is supplied to the force sensor, a difference between impedance 154 at the time of force application and impedance 151 at the time of no force application in a case where the force sensor is partially attached to the circuit board is relatively greater than a difference between impedance 153 at the time of force application and impedance 152 at the time of no force application in a case where the force sensor is wholly attached to the circuit board. That is, the change in impedance is greater when the force sensor is partially attached than when the force sensor is wholly attached. Here, the change in impedance refers to a difference in impedance between when a force is applied and when no force is applied in the same state (e.g., in the whole attachment state or in the partial attachment state) in a case where a voltage at a specific frequency between the resonance frequency and the antiresonance frequency is applied to the force sensor.

The above phenomenon is understood to occur because the degree to which the vibration of the force sensor is hindered varies according to the area of the attachment portion of the force sensor. That is, the force sensor vibrates according to the frequency of the power applied to the force sensor. Here, if the force sensor is strongly coupled to the circuit board, the vibration of the force sensor is hindered, or dampened. Therefore, a rate of vibration change due to force application is reduced. On the other hand, if a portion of the force sensor is not coupled to the circuit board, the force sensor may vibrate sufficiently when no force is applied due to a low vibration hindrance rate, and the vibration change rate due to force application may be relatively greater. Therefore, the difference in impedance between when no force is applied and when a force is applied is greater when the force sensor is partially attached than when the force sensor is wholly attached. Thus, the sensitivity of the force sensor can be improved when the force sensor is partially attached.

According to an embodiment, the area of a portion of the force sensor that is attached to the circuit board may be reduced to increase the change in the impedance of the force sensor, thereby improving the sensitivity of the force sensor.

Figure 6:
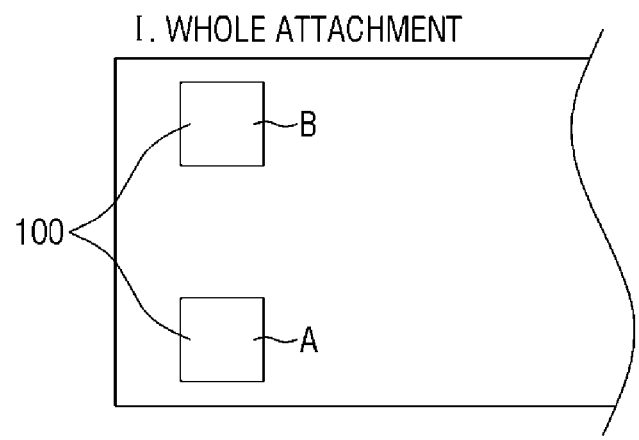
FIG. 6 is an experimental design drawing for explaining the change in the impedance of a force sensor, for example, a plan view illustrating a case where various samples of force sensors are wholly or partially attached to a circuit board.
Figure 6:
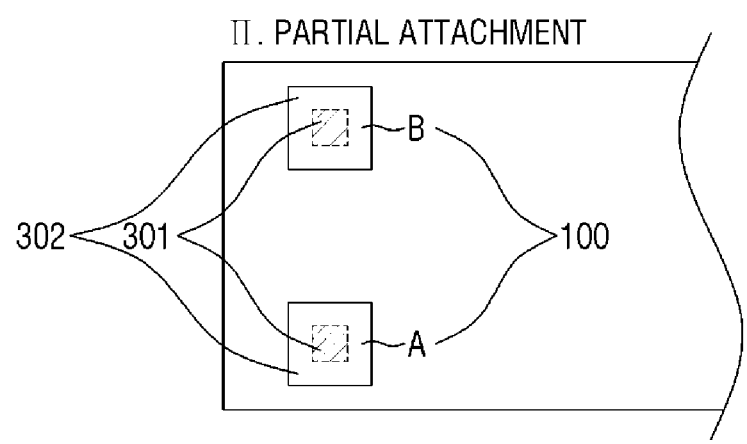

FIG. 6 is an experimental design drawing for explaining the change in the impedance of a force sensor, for example, a plan view illustrating a case where various samples of force sensors are wholly or partially attached to a circuit board.

Referring to FIG. 6, a plurality of force sensors 100 are attached to the same positions A and B on a circuit board in order to compare a first case "case I" where the force sensors 100 are wholly attached to the circuit board with a second case "case II" where the force sensors 100 are partially attached to the circuit board. Then, a voltage is measured according to frequency at each position A or B before and after a force is applied to the force sensors 100 to compare the case I of whole attachment and the case II of partial attachment.

The voltage measured is a voltage applied to the resistor Rs connected to the force sensor of FIG. 3. The larger the impedance of the force sensor, the smaller the voltage across the resistor Rs becomes, and the smaller the impedance of the force sensor, the larger the voltage across the resistor Rs becomes. In addition, the larger the difference (the larger the voltage change) between an initial voltage before a force is applied and a voltage when a force is applied, the greater the change in the impedance of the force sensor (that is, the force sensor has higher sensitivity).

As for the force sensor located at the position A, at a resonance point, the change between the initial voltage before a force is applied and the voltage when a force is applied is about 80 mV in the case I of whole attachment, but is about 90 mV in the case II of partial attachment. Therefore, it can be seen that the voltage change is larger in the case II of partial attachment than in the case I of whole attachment. That is, it can be seen that the sensitivity of the force sensor at the resonance point is about 12% higher in the case II of partial attachment than the sensitivity of the force sensor at the resonance point in the case I of whole attachment.

The sensitivity of the force sensor at an antiresonance point is also higher in the case II of partial attachment than in the case I of whole thermal attachment. For example, the sensitivity of the force sensor at the position A is about 6% higher, and the sensitivity of the force sensor at the position B may be about 8% higher at both the resonance point and the antiresonance point.

Therefore, according to an embodiment, an attachment layer for attaching a force sensor to a circuit board may be formed only on a portion of, and not on the entire surface of, the force sensor as illustrated in FIGS. 4A and 4B, thereby improving the sensitivity to force.

Figure 7:
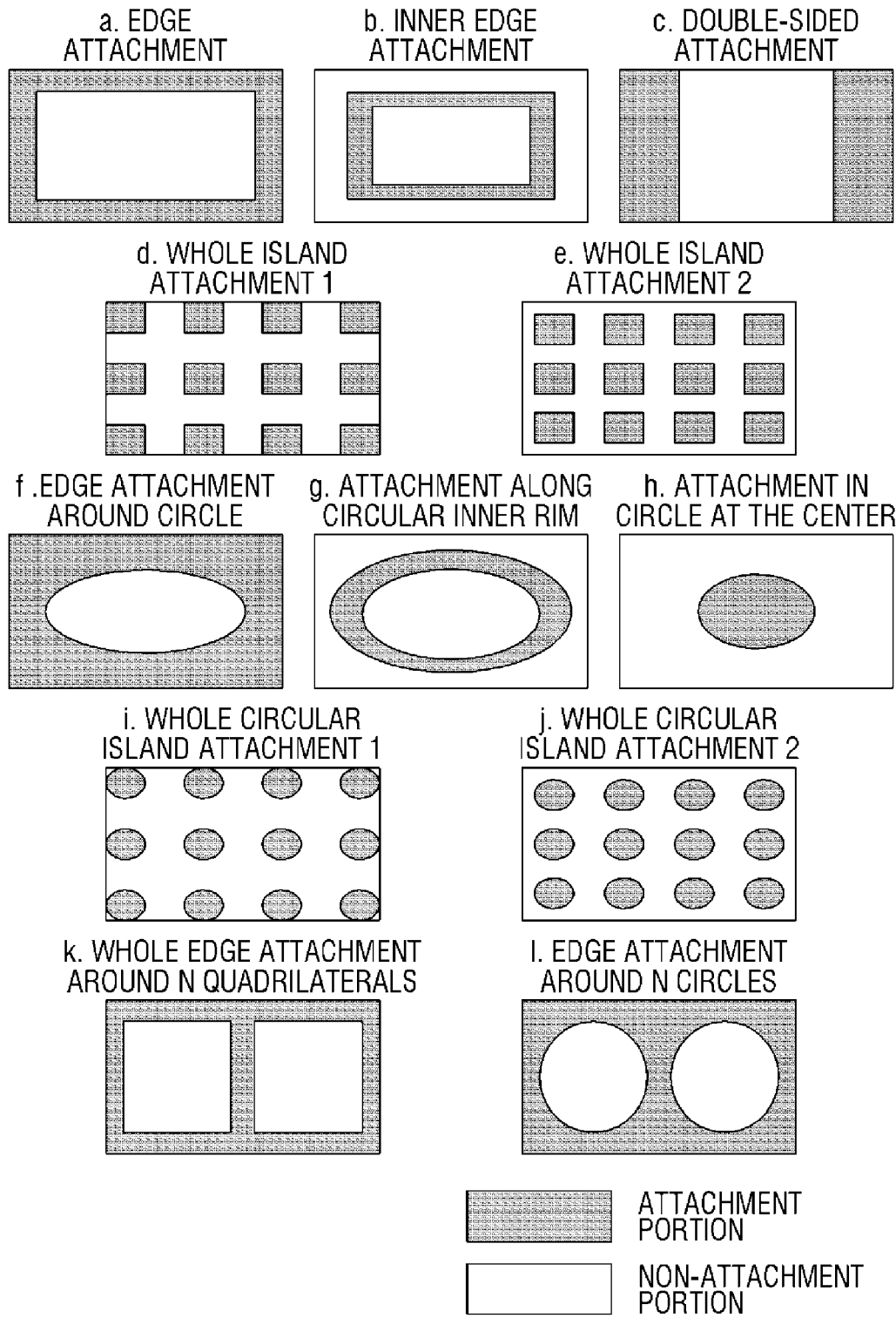
FIGS. 7 and 8 are plan views illustrating pattern shapes of an attachment portion according to various embodiments.
Figure 8:
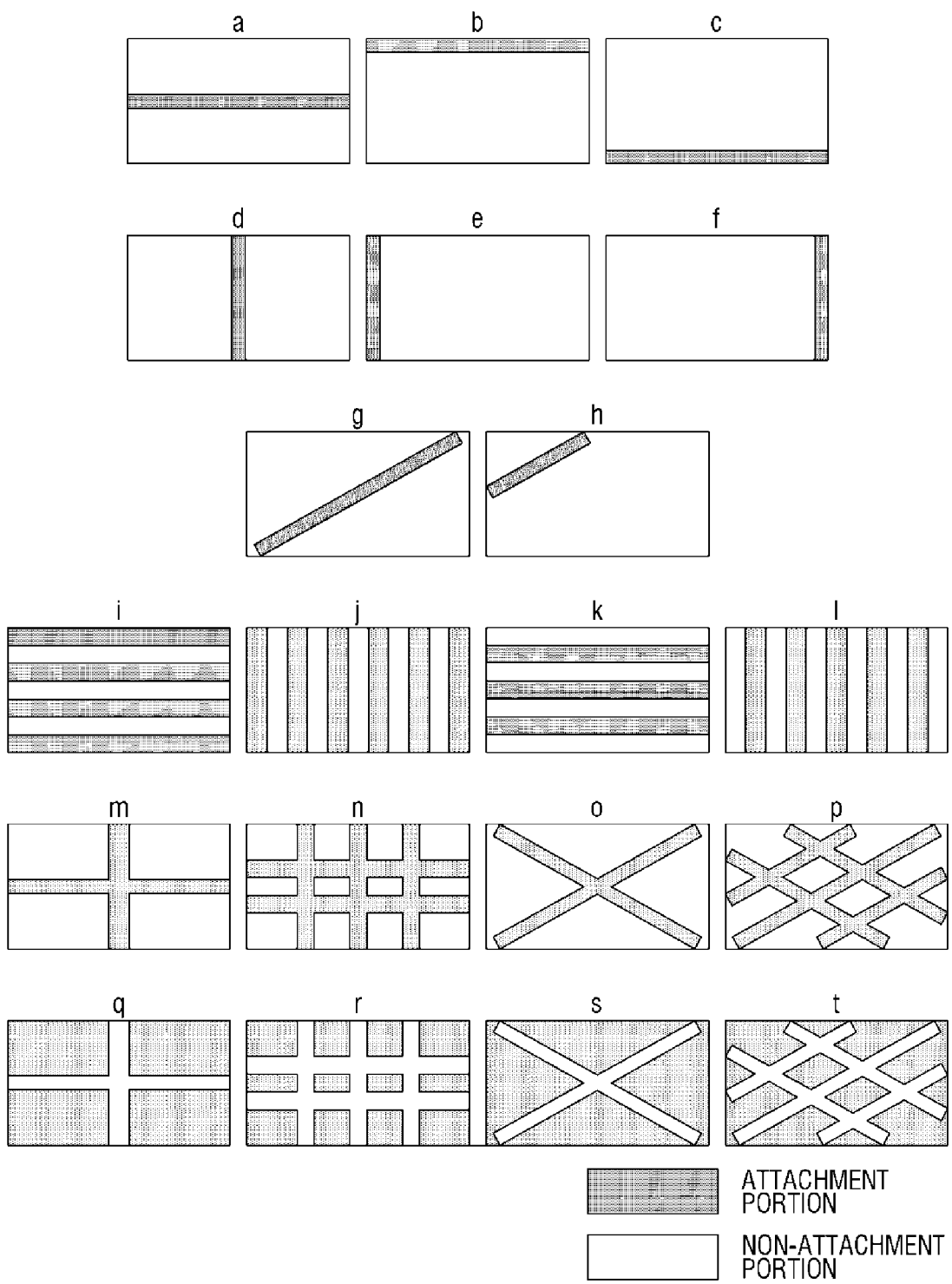

FIGS. 7 and 8 are plan views illustrating pattern shapes of the attachment portion 301 according to various embodiments. FIGS. 7 and 8 show that the pattern shape of the attachment portion 301 is not limited to the shape illustrated in FIGS. 4A and 4B, but can be variously modified.

In FIG. 7a, the attachment portion 301 is formed along edges of a force sensor. The attachment portion 301 may be located up to the edges of the force sensor. A width of the attachment portion 301 may be, but is not limited to, constant.

The attachment portion 301 may also be formed in the shape of inner edges as illustrated in FIG. 7b, or may be formed at both ends of a bonding surface of the force sensor as illustrated in FIG. 7c.

As illustrated in FIGS. 7d and 7e, the attachment portion(s) 301 may be formed in the shape of quadrilateral islands to attach the force sensor to a circuit board.

The attachment portion(s) 301 may also be formed in a circular shape or elliptical shape as illustrated in FIGS. 7f through 7j, instead of an angular shape. For example, the attachment portion 301 may be formed only in an edge portion of the force sensor, leaving a circle at the center (see FIG. 7f), may be formed only in a circular portion at the center (FIG. 7h), or may be located along a circular rim (e.g., as a ring-shaped circular or elliptical shape) inside the bonding surface of the force sensor (see FIG. 7g).

Further, a plurality of quadrilaterals or a plurality of circles may be formed by, or defined by, the attachment portion 301 as illustrated in FIGS. 7k and 7i FIG. 8 shows that the attachment portion 301 can be located in a stripe shape.

That is, as illustrated in FIGS. 8a through 8h, the attachment portion 301 may be formed in the shape of a single stripe across the bonding surface of the force sensor to attach the force sensor to the circuit board. A length of the stripe may be, but is not limited to, equal to a length or width of the bonding surface, or even equal to a diagonal length of the bonding surface. The stripe may also have various widths.

The stripe-shaped attachment portion 301 may be formed parallel to a horizontal or vertical surface of the force sensor, but may also be formed diagonally as illustrated in FIG. 8g or 8h.

Alternatively, the attachment portion(s) 301 may be formed in the shape of a plurality of stripes as illustrated in FIGS. 8i through 8l, or may be formed in a shape in which a plurality of stripes cross each other as illustrated in FIGS. 8m through 8p.

As illustrated in FIGS. 8q through 8t, the attachment portion 301 may also be formed only in an area excluding a stripe shape (e.g., the attachment portion 301 may define one or more stripe shapes). In this case, a portion of the force sensor that is not attached to the circuit board may be the stripe shape.

As described above, the attachment portion 301 may be formed in various patterns and is not limited to the shapes illustrated in FIGS. 7 and 8.

In one of the embodiments described above, the whole of the piezoelectric element has a rectangular shape. However, the piezoelectric element may also have various shapes such as elliptical, circular, and polygonal shapes.

Figure 9:
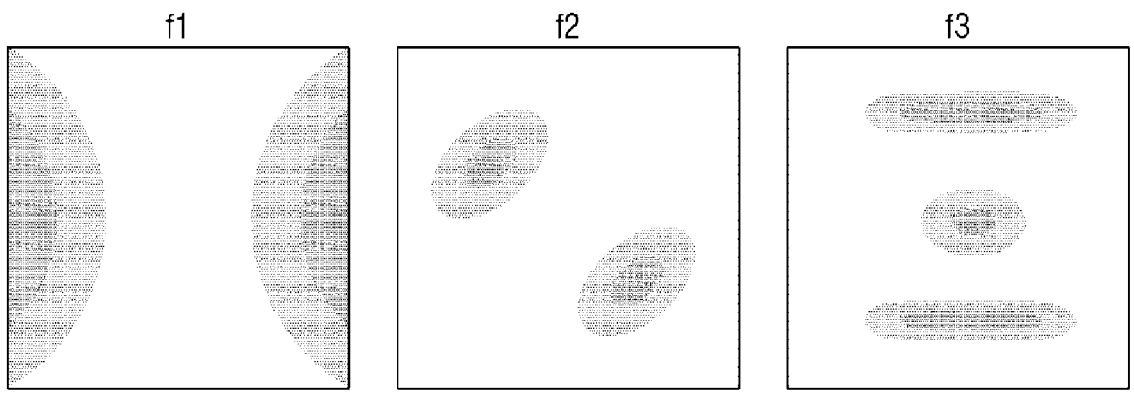
FIG. 9 illustrates vibration displacements of a piezoelectric element at a resonance frequency and an antiresonance frequency according to embodiments.
Figure 10:
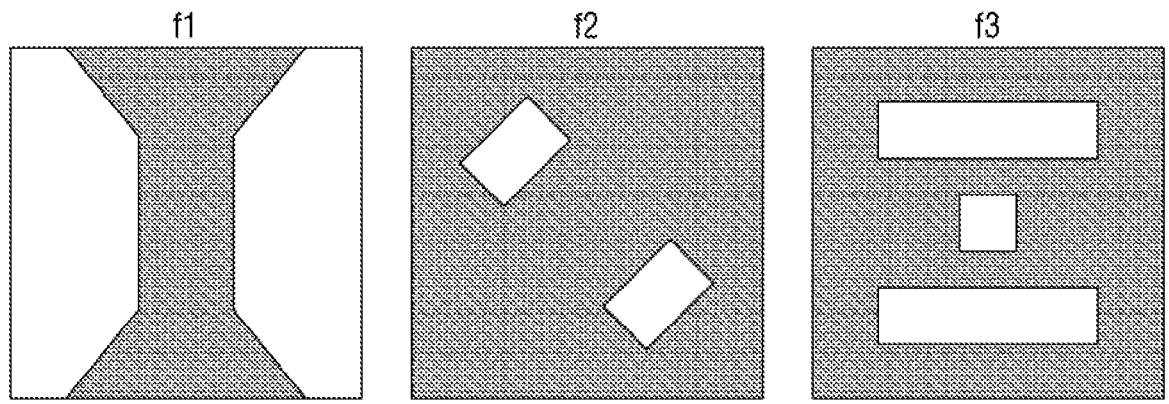
FIG. 10 illustrates the position of the attachment portion in each mode of FIG. 9.
Figure 10:
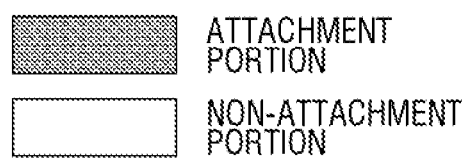

FIG. 9 illustrates vibration displacements of a piezoelectric element at a resonance frequency and an antiresonance frequency according to embodiments. FIG. 10 illustrates the position of the attachment portion 301 in each mode of FIG. 9.

As described above, when an AC voltage is applied to a force sensor, the surface of the force sensor vibrates. Here, the surface of the force sensor may vibrate in a different form according to frequency. There may be a plurality of resonance frequencies and a plurality of antiresonance frequencies as described above, and each frequency f1, f2 or f3 illustrated in FIGS. 9 and 10 may be any one of the resonance frequencies or the antiresonance frequencies.

As apparent from the simulation results illustrated in FIG. 9, when voltages that have different resonance or antiresonance frequencies are applied to the force sensor, the form in which the surface of the force sensor vibrates may vary according to the frequency.

In FIG. 9, a dark area is an area where the force sensor vibrates relatively greatly, and a light area is an area where the force sensor does not vibrate as greatly. That is, the light area is an area where the vibration displacement of the force sensor is minimized.

The position of the attachment portion(s) 301 illustrated in FIG. 10 corresponds to the area(s) where the displacement of the vibration sensor is reduced or minimized in FIG. 9. That is, the force sensor is attached to a circuit board only in a portion where the vibration displacement of the force sensor according to the frequency is restricted or minimized.

For example, when a voltage having the frequency f1 of FIG. 9 is applied, an area where the vibration displacement of the force sensor is large is in the shape of a semicircle located at both ends of the force sensor, and an area where the vibration displacement of the force sensor is restricted or minimized is a portion excluding the semicircles, and is in the shape of a sandglass/hourglass. Therefore, at the frequency f1 of FIG. 10, the attachment portion 301 may be formed in the shape of a pillar pattern having upper and lower portions that are wider than a middle portion.

As illustrated in FIG. 10, the circuit board is attached only to an area of the force sensor where the vibration displacement of the force sensor is small, which may increase or maximize the sensitivity of the force sensor by reducing or minimizing the effect on the vibrating motion of the force sensor. If the circuit board is attached to an area where the vibration displacement of the force sensor is relatively large, the vibrating motion of the force sensor may be hindered. Therefore, the change in impedance between a force applied state and an initial state may be small.

In this regard, according to an embodiment, the attachment portion 301 may be formed in the area where the vibration displacement of the force sensor is relatively small in order to increase or maximize the change in the impedance of the force sensor, thereby improving the sensitivity of the force sensor.

Figure 11:
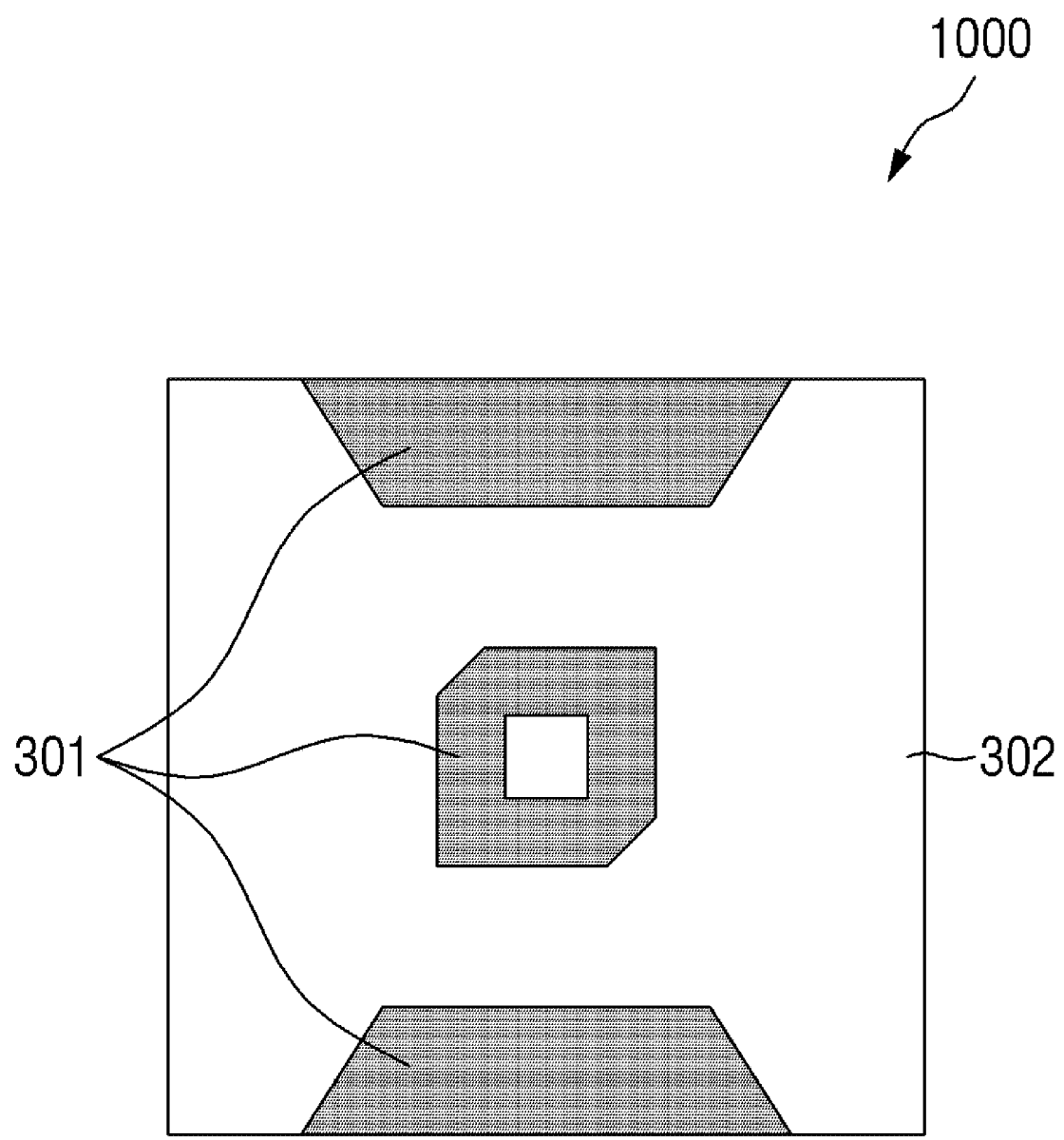
FIG. 11 is a plan view illustrating a pattern shape of an attachment portion according to an embodiment.

FIG. 11 is a plan view illustrating a pattern shape of an attachment portion according to an embodiment.

The attachment portion illustrated in FIG. 11 has a pattern that maximizes the sensitivity of a force sensor at various frequencies. That is, a shape that can increase or maximize the sensitivity of the force sensor at all of the various resonance frequencies and antiresonance frequencies illustrated in FIGS. 9 and 10 corresponds to a common intersection area of the shapes of the attachment portion at the frequencies f1 through f3 of FIG. 10. Therefore, if the force sensor is attached to a circuit board in the shape of the attachment portion illustrated in FIG. 11, it is applicable even when power is supplied at various frequencies.

Figure 12:
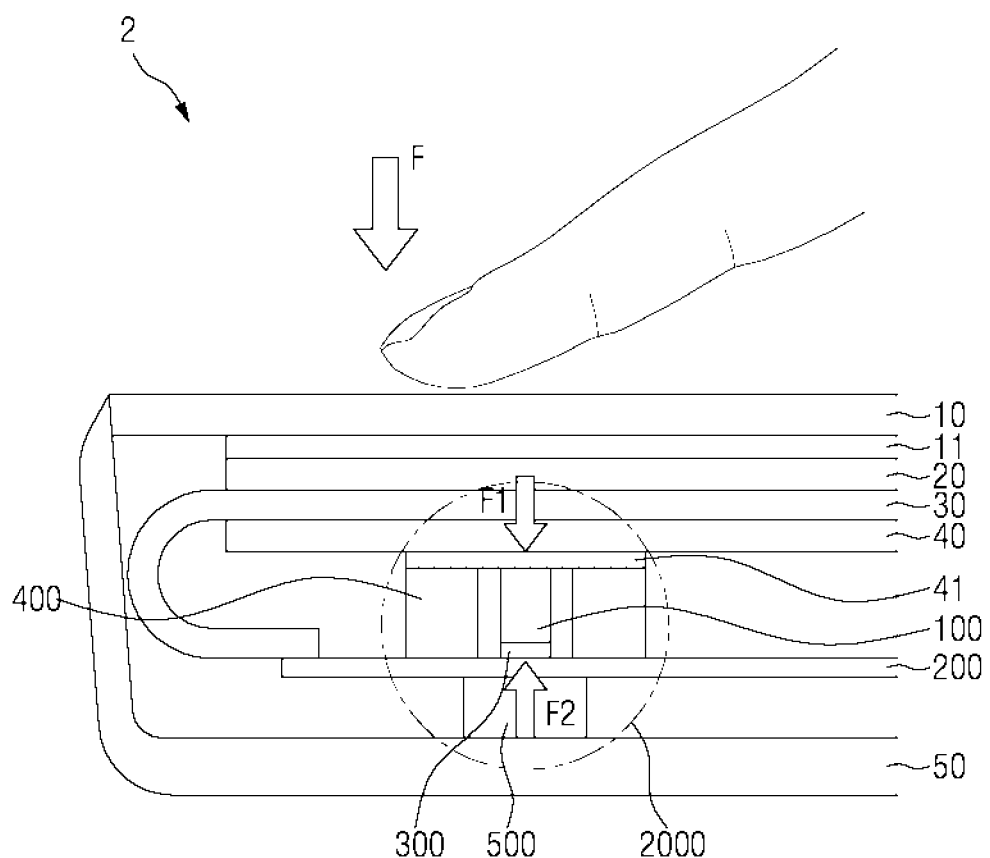
FIG. 12 is a cross-sectional view of a display device according to an embodiment.

FIG. 12 is a cross-sectional view of a display device 2 according to an embodiment.

The display device 2 according to the embodiment of FIG. 12 is substantially the same as the display device 1 according to the embodiment of FIG. 2 except for the configuration of a force sensor module 2000. Therefore, a redundant description of the display device 2 will be omitted, and the current embodiment will now be described while focusing mainly on differences from the previous embodiment.

Referring to FIG. 12, the force sensor module 2000 according to the current embodiment is different from the force sensor module 1000 according to the embodiment of FIG. 2 in that it includes a support 400 that is located along the perimeter of a force sensor 100 while being spaced apart from the force sensor 100, and in that it also includes a pedestal 500 that overlaps the force sensor 100 in the thickness direction and that is located below a circuit board 200, in addition to the force sensor 100 and the circuit board 200 to which the force sensor 100 is attached.

The force sensor module 2000 may be attached and fixed to a lower surface of a cover panel 40 by an adhesive layer 41. The adhesive layer 41 may be made of an insulating material (e.g., an electrically insulating material). Therefore, the force sensor module 2000 is not electrically connected to a display panel 30 and the cover panel 40 located on the adhesive layer 41.

The support 400 of the force sensor module 2000 is located around side surfaces of the force sensor 100. The support 400 may surround the side surfaces of the force sensor 100. The support 400 includes or defines an open portion, and the force sensor 100 may be located in the open portion. Inner walls of the open portion of the support 400 may be spaced apart from the force sensor 100. A height of the support 400 may be substantially the same as the sum of a height of the force sensor 100 and a thickness of an attachment layer 300.

A lower surface of the attachment layer 300 and a lower surface of the support 400 of the force sensor module 2000 may lie on a plane of the circuit board 200. The support 400 may increase the surface area of the force sensor module 2000 located on the circuit board 200, thereby performing the function of planarizing the force sensor module 2000. If the force sensor 100 was to be located between the cover panel 40 and the circuit board 200 without the support 400, it would potentially be easily detached from the cover panel 40 and the circuit board 200 due to a small adhesion area. However, because the support 400 located around the force sensor 100 is also attached to the cover panel 40 and the circuit board 200 in the current embodiment, the detachment of the force sensor 100 can be avoided. An upper surface of the support 400 may be in contact with the adhesive layer 41.

The support 400 may be made of a soft material. The support 400 may be made of a material having a hardness that is lower than that of the force sensor 100. Accordingly, when the force sensor 100 receives a force from a window 10 and/or the circuit board 200, the received force may be concentrated on the force sensor 100 without being dispersed to the support 400.

The pedestal 500 may be located below the circuit board 200. The pedestal 500 may overlap the force sensor 100 in the thickness direction. The pedestal 500 may have, but is not limited to, a pillar shape. The pedestal 500 may be located between the circuit board 200 and a bracket 50. The pedestal 500 may be made of a ductile material having elasticity.

When the force sensor 100 is pressed by a force, the pedestal 500 may serve to increase a force F2 received from the bracket 50 (e.g. because the pedestal 500 has an area in a plan view that is less than that of the support 400). That is, a force transmitted to the force sensor 100 may be doubled or increased by a force F1 transmitted from the window 10 and the force F2 transmitted from the pedestal 500.

Therefore, because the force transmitted to the force sensor 100 is larger when the pedestal 500 is present than when the pedestal 500 is absent, the vibration of the force sensor 100 can be effectively suppressed at the time of force application. If the vibration of the force sensor 100 is effectively suppressed at the time of force application (e.g. while not being suppressed when no force is applied), the sensitivity of the force sensor 100 can be improved because a change in the impedance of the force sensor 100 can be increased or maximized at the resonance frequency and the antiresonance frequency described above.

Further, the pedestal 500 may also serve to absorb an impact on the entire display device 2.

Although the attachment layer 300 is formed on the entire lower surface of the force sensor 100 in the drawing, it may instead be formed only on a portion of the lower surface of the force sensor 100 as in the embodiment of FIG. 2, thereby dividing the force sensor 100 into an attachment portion and a non-attachment portion.

Figure 13:
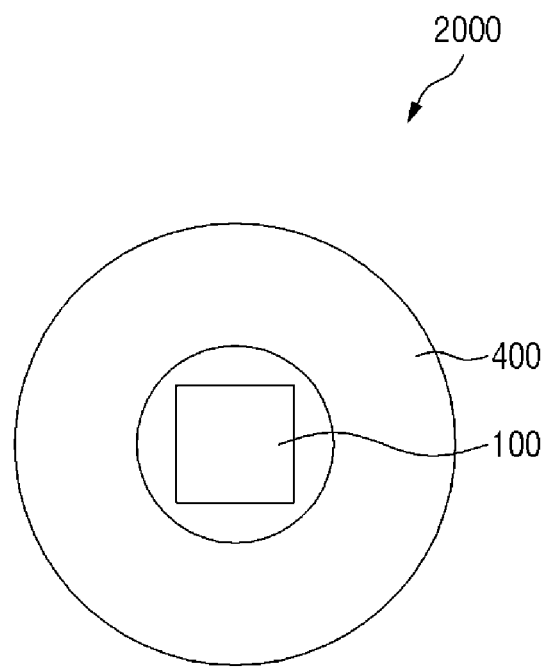
FIG. 13 is a plan view of a force sensor and a support according to an embodiment.

FIG. 13 is a plan view of a force sensor 100 and a support 400 according to an embodiment.

Referring to FIG. 13, the support 400 may be formed in a donut shape surrounding an outer surface of the force sensor 100 in a plan view. The planar shape of the force sensor 100 may be a quadrilateral shape, as illustrated in FIG. 13. However, the planar shape of the force sensor 100 is not limited to the quadrilateral shape, and the force sensor 100 may also have various planar shapes such as circular and elliptical shapes.

Figure 14:
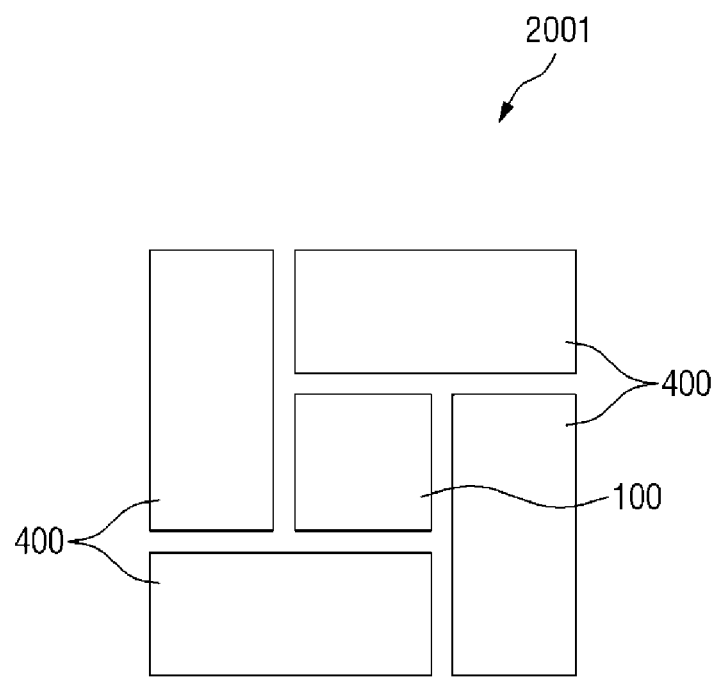
FIG. 14 is a plan view of a force sensor and a support according to an embodiment.

FIG. 14 is a plan view of a force sensor 100 and a support(s) 400 according to an embodiment. Referring to FIG. 14, the support(s) 400 may be formed as a plurality of rectangles in a plan view.

Referring to FIGS. 13 and 14, the support(s) 400 may surround the force sensor 100 with a space between the support 400 and the force sensor 100. The support(s) 400 may be formed around the force sensor 100 in a shape for increasing the surface area of a force sensor module 2000 or 2001, and may be a structure for increasing or maximizing a planarization function.

The space between the force sensor 100 and the support(s) 400 may prevent the vibration of the force sensor 100 from being hindered when AC power is being supplied to the force sensor 100.

That is, the force sensor module 2000 and 2001 according to the embodiments may be structured as to not hinder the vibration of the force sensor 100 when a force is not applied to the force sensor 100, and may also be structured to suppress the vibration of the force sensor 100 (e.g., as much as reasonably possible) when a force is applied to the force sensor 100, thereby improving the sensitivity of the force sensor 100.

Figure 15:
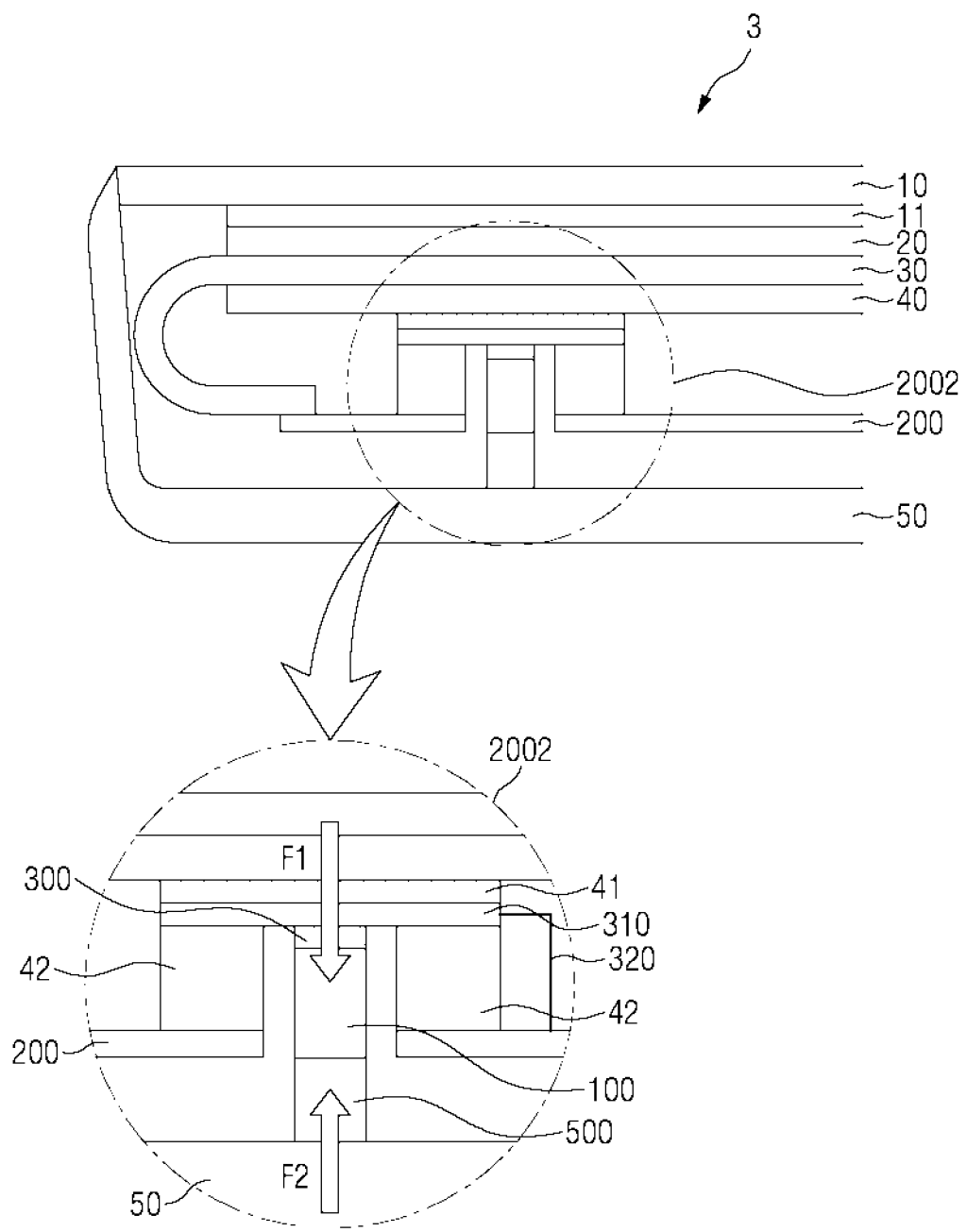
FIG. 15 is a cross-sectional view of a display device according to an embodiment.

FIG. 15 is a cross-sectional view of a display device 3 according to an embodiment.

The display device 3 according to the embodiment of FIG. 15 is different from the display device 2 according to the embodiment of FIG. 12 in that a force sensor module 2002 includes a second circuit board 310 in addition to a first circuit board 200, and includes a second adhesive layer 42 instead of a support.

For example, the second circuit board 310 is located below a first adhesive layer 41, and the second adhesive layer 42 and a force sensor 100 are located below the second circuit board 310. The first circuit board 200 is located below the second adhesive layer 42. The first circuit board 200 includes or defines a hole, and the force sensor 100 is located inside the hole. Like the support 400 of FIG. 12, the second adhesive layer 42 surrounds the force sensor 100. An upper surface of the second adhesive layer 42 is bonded to the second circuit board 310, and a lower surface of the second adhesive layer 42 is bonded to an upper surface of the first circuit board 200.

An upper surface of the force sensor 100 is electrically connected to the second circuit board 310 by an attachment layer 300. A lower surface of the force sensor 100 may be connected to a pedestal 500.

The first circuit board 200 and the second circuit board 310 may be electrically connected to each other by a connection wiring 320. Therefore, the force sensor 100 may be electrically connected to the first circuit board 200 by the attachment layer 300, the second circuit board 310, and the connection wiring 320. Accordingly, the force sensor 100 may receive driving power from the first circuit board 200.

A height of the pedestal 500 may correspond to, but is not limited to, a distance between the position of the first circuit board 200 and a bracket 50 as illustrated in FIG. 15.

In the current embodiment, the sensitivity of the force sensor 100 can be improved through the second adhesive layer 42 and the pedestal 500. Further, because the force sensor 100 is located inside the hole of the first circuit board 200, a thickness of the display device 3 can be reduced.

Figure 16:
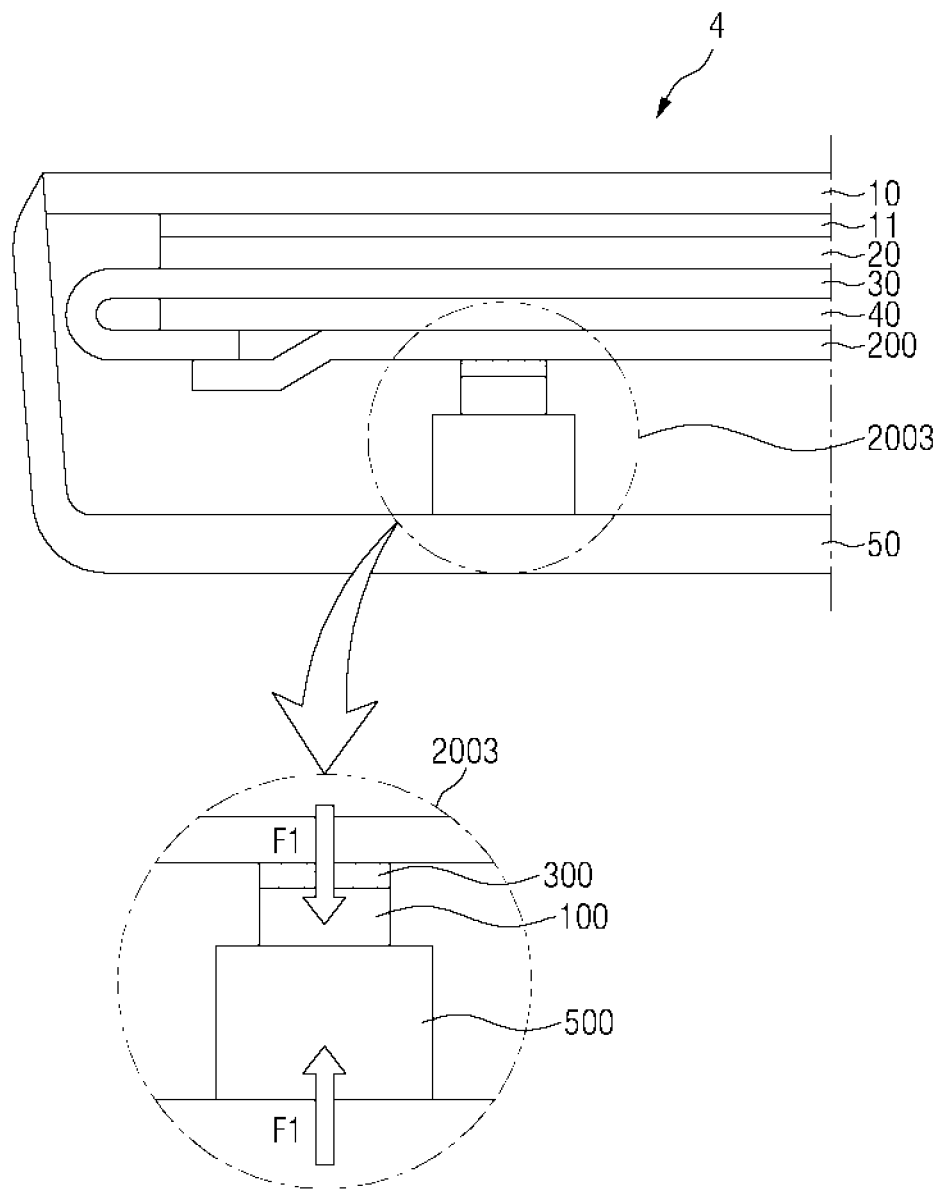
FIG. 16 is a cross-sectional view of a display device according to an embodiment.

FIG. 16 is a cross-sectional view of a display device 4 according to an embodiment.

The display device 4 according to the embodiment of FIG. 16 is different from the display device 2 according to the embodiment of FIG. 12 with regard to a stacking order of a force sensor 100 and a circuit board 200 of a force sensor module 2003.

For example, the circuit board 200 may be located below a cover panel 40, and an attachment layer 300, the force sensor 100, and a pedestal 500 may be sequentially located below the circuit board 200. Because the force sensor 100 is electrically connected to the circuit board 200 by the attachment layer 300, and because the bottom of the force sensor 100 is supported by the pedestal 500, the sensitivity of the force sensor 100 can be improved as in the embodiments of FIGS. 12 and 15. The force sensor module 2003 illustrated in FIG. 16 may have fewer components, and may be manufactured in a simpler assembly process than the force sensor modules 2000 and 2002 illustrated in FIGS. 12 and 15.

In the display device 4 of FIG. 16, only the cover panel 40 is located between the circuit board 200 and a display panel 30. Therefore, the display panel 30 including a bending portion may be bent to have greater curvature.

Figure 17:
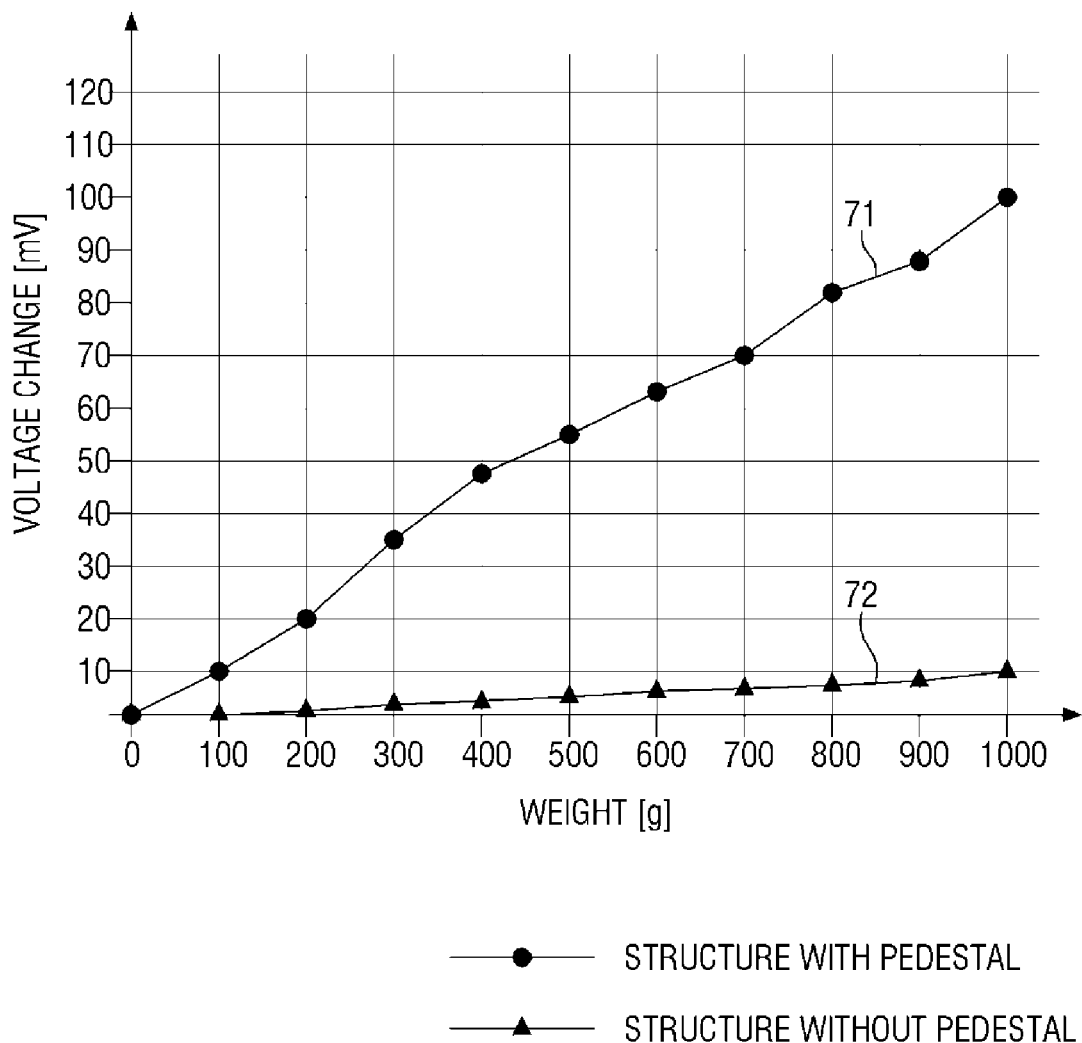
FIG. 17 is a graph illustrating voltage change with respect to the force applied to a force sensor according to an embodiment.

FIG. 17 is a graph illustrating voltage change with respect to the force applied to a force sensor according to an embodiment. FIG. 17 illustrates a voltage change when a force corresponding to a weight applied to each of a display device having a force sensor module including a pedestal 500 and a display device not including the pedestal 500.

In FIG. 17, the x-axis represents force, that is, the weight [g] applied, and the y-axis represents voltage change [mV].

A voltage change denotes a voltage change of the resistor Rs illustrated in FIG. 2 between when a force is applied at a resonance frequency and when no force is applied. That is, the voltage change denotes a change in the impedance of a force sensor when a force is applied to the force sensor.

As apparent from FIG. 17, as the weight (which is a physical stimulus) increases, the voltage change exhibits noticeably linear characteristics in a structure with a pedestal (indicated by reference numeral 71). In addition, a larger voltage change is observed in the structure with the pedestal than in a structure without the pedestal (indicated by reference numeral 72). Here, a large voltage change indicates a relatively large change in the impedance of the force sensor due to force application, and thus a relatively great sensitivity to force.

Therefore, it can be seen from FIG. 17 that the sensitivity of a display device to force can be further improved by installing a pedestal in a force sensor module.

Accordingly, a force sensor according to an embodiment can have improved force sensing sensitivity. In addition, a display device including such a force sensor according to an embodiment can more accurately recognize a force input.

However, the effects of the embodiments are not restricted to the one set forth herein. The above and other effects of the embodiments will become more apparent to one of daily skill in the art to which the embodiments pertain by referencing the claims.

While the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims, with functional equivalents thereof to be included. The exemplary embodiments should be considered in a descriptive sense only and not for purposes of limitation.

What is claimed is:

1. A display device comprising:
a display panel;
a first circuit board defining a hole;
a second circuit board; and
a force sensor module inserted in the hole, overlapping the display panel, and comprising:
a force sensor partially attached to the second circuit board, and comprising:
an attachment portion having a surface facing the second circuit board and attached to the second circuit board; and
a non-attachment portion having a surface spaced apart from the second circuit board.

2. The display device of claim 1, wherein the force sensor module further comprises an attachment layer between the force sensor and the second circuit board at the attachment portion.

3. The display device of claim 2, wherein the attachment layer is an electrical connection layer.

4. The display device of claim 3, wherein the force sensor is electrically connected to the second circuit board by the attachment layer.

5. The display device of claim 4, wherein the attachment layer is located along an edge of the surface facing the second circuit board.

6. The display device of claim 1, wherein the force sensor further comprises a piezoelectric element that is configured to be driven by alternating current (AC) power.

7. The display device of claim 6, wherein the AC power has a resonance frequency, an antiresonance frequency, or a frequency between an adjacent resonance frequency and an adjacent antiresonance frequency.

8. A display device comprising:
a display panel; and
a force sensor module overlapping the display panel, and comprising:
a force sensor;
a pedestal overlapping the force sensor in a thickness direction; and
a circuit board to which the force sensor is at least partially attached, wherein the circuit board is between the force sensor and the pedestal, or wherein the force sensor is between the circuit board and the pedestal.

9. The display device of claim 8, further comprising a support surrounding side surfaces of, and being spaced apart from, the force sensor.

10. The display device of claim 8, wherein the force sensor comprises an attachment portion in which a surface of the force sensor facing the circuit board is attached to the circuit board, and a non-attachment portion spaced apart from the circuit board.

11. The display device of claim 8, wherein the force sensor module further comprises:
an additional circuit board defining a hole into which the force sensor is inserted; and
a connection wiring electrically connecting the additional circuit board and the circuit board.

12. The display device of claim 11, wherein the force sensor module further comprises an adhesive layer between the additional circuit board and the circuit board, and surrounding the force sensor.

13. A force sensor module comprising:
a circuit board;
a force sensor partially attached to the circuit board, and comprising:
an attachment portion in which a surface of the force sensor facing the circuit board is attached to the circuit board; and
a non-attachment portion spaced apart from the circuit board; and
a pedestal overlapping the force sensor,
wherein the circuit board is between the force sensor and the pedestal.

14. The force sensor module of claim 13, further comprising an attachment layer between the force sensor and the circuit board at the attachment portion.

15. The force sensor module of claim 14, wherein the attachment layer is an electrical connection layer for electrically connecting the force sensor to the circuit board.

16. The force sensor module of claim 15, wherein the attachment layer is located along an edge of the surface of the force sensor facing the circuit board.

17. The force sensor module of claim 13, further comprising a support surrounding side surfaces of, and spaced apart from, the force sensor.

* * * * *